(12) United States Patent
Adachi

(10) Patent No.: US 12,520,508 B2
(45) Date of Patent: Jan. 6, 2026

(54) ENHANCED LOW-LOSS SEMICONDUCTOR CAPACITOR DEVICE FEATURING ASYMMETRIC ELECTRODE SHIELDING ARCHITECTURE

(71) Applicant: Murata Manufacturing Co., Ltd., Nagaokakyo (JP)

(72) Inventor: Nobuyoshi Adachi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 557 days.

(21) Appl. No.: 18/045,530

(22) Filed: Oct. 11, 2022

(65) Prior Publication Data

US 2023/0054863 A1 Feb. 23, 2023

Related U.S. Application Data

(63) Continuation of application No. PCT/JP2021/016915, filed on Apr. 28, 2021.

(30) Foreign Application Priority Data

May 1, 2020 (JP) .................. 2020-081367

(51) Int. Cl.
*H10D 1/68* (2025.01)
*H01G 4/08* (2006.01)

(52) U.S. Cl.
CPC ............... *H10D 1/692* (2025.01); *H01G 4/08* (2013.01)

(58) Field of Classification Search
CPC ................................................... H10D 10/692
See application file for complete search history.

(56) References Cited

U.S. PATENT DOCUMENTS

| 2002/0126438 | A1 | 9/2002 | Liu | |
|---|---|---|---|---|
| 2003/0181017 | A1* | 9/2003 | Mikawa | H10D 1/682 |
| | | | | 257/E21.011 |
| 2008/0191260 | A1 | 8/2008 | De Vreede et al. | |

(Continued)

FOREIGN PATENT DOCUMENTS

| JP | H0689831 A | 3/1994 |
|---|---|---|
| JP | 2002506283 A | 2/2002 |

(Continued)

OTHER PUBLICATIONS

International Search Report in PCT/JP2021/016915, mailed Jul. 27, 2021, 5 pages.

*Primary Examiner* — Kevin Parendo
(74) *Attorney, Agent, or Firm* — ArentFox Schiff LLP

(57) ABSTRACT

A semiconductor device is provided having a semiconductor substrate with a circuit layer provided on a first main surface of the semiconductor substrate. The circuit layer includes a first and second electrode layers with a dielectric layer disposed therebetween, a first outer electrode electrically connected to the first electrode layer and a second outer electrode electrically connected to the second electrode layer. When the circuit layer is viewed from above, the first electrode layer has a first facing portion facing the second electrode layer in the thickness direction and a first non-facing portion not facing the second electrode layer, and the second electrode layer has a second facing portion facing the first electrode layer in the thickness direction and a second non-facing portion not facing the first electrode layer.

20 Claims, 10 Drawing Sheets

(56) References Cited

U.S. PATENT DOCUMENTS

| | | | |
|---|---|---|---|
| 2014/0041915 A1 | 2/2014 | Hattori et al. | |
| 2015/0243412 A1* | 8/2015 | Kondo | H01G 2/065 |
| | | | 338/315 |
| 2015/0294936 A1* | 10/2015 | Shen | H10D 1/68 |
| | | | 257/532 |
| 2019/0244761 A1 | 8/2019 | Kagawa et al. | |

FOREIGN PATENT DOCUMENTS

| | | |
|---|---|---|
| JP | 2008516441 A | 5/2008 |
| JP | 2014036170 A | 2/2014 |
| JP | 2017228638 A | 12/2017 |
| WO | 2014050322 A1 | 4/2014 |
| WO | 2018083973 A1 | 5/2018 |

\* cited by examiner

ENHANCED LOW-LOSS SEMICONDUCTOR CAPACITOR DEVICE FEATURING ASYMMETRIC ELECTRODE SHIELDING ARCHITECTURE

CROSS REFERENCE TO RELATED APPLICATIONS

This application is a continuation of PCT Application No. PCT/JP2021/016915, filed Apr. 28, 2021, which claims priority to Japanese Patent Application No. 2020-081367, filed May 1, 2020, the entire contents of each of which are hereby incorporated by reference in their entirety.

TECHNICAL FIELD

The present invention relates to a semiconductor device and a module.

BACKGROUND

One conventional capacitor element that can be used in a semiconductor integrated circuit, for example, is a metal insulator metal (MIM) capacitor. The MIM capacitor has a parallel-plate type structure in which a dielectric body is sandwiched between a lower electrode and an upper electrode.

For example, Japanese Unexamined Patent Application Publication No. 2017-228638 (hereinafter "Patent Document 1") discloses a capacitor including a substrate, a lower electrode formed on the substrate, an upper electrode of which periphery partially overlaps the lower electrode to partially cover the lower electrode with other portion of the periphery being positioned outside the lower electrode, a dielectric film provided at least between the lower electrode and the upper electrode, a first outer terminal provided in a region not covered by the upper electrode on the lower electrode, and a second outer terminal at least part of which is provided outside the lower electrode on the upper electrode, in which the periphery of the upper electrode partially has a recess recessed in a direction approaching the second outer terminal.

However, in the capacitor described in Patent Document 1, since many regions in which the lower electrode is not disposed between the upper electrode and the support substrate are present, there is a problem that an electric field generated from the upper electrode intrudes into the support substrate and causes conductor loss.

SUMMARY OF THE INVENTION

Accordingly, the exemplary embodiments of the present invention provide a low-loss semiconductor device and a module.

According to an exemplary aspect, a semiconductor device is provided that includes a semiconductor substrate having a first main surface and a second main surface opposite to each other in a thickness direction, a first end surface and a second end surface opposite to each other in a length direction orthogonal to the thickness direction, a first side surface and a second side surface opposite to each other in a width direction orthogonal to the thickness direction and the length direction; and a circuit layer disposed on the first main surface of the semiconductor substrate. Moreover, the circuit layer includes a first electrode layer provided on a side of the semiconductor substrate, a dielectric layer provided on the first electrode layer, a second electrode layer provided on the dielectric layer, a first outer electrode electrically connected to the first electrode layer and extended to a surface of the circuit layer on a side opposite from the semiconductor substrate, and a second outer electrode electrically connected to the second electrode layer and extended to the surface of the circuit layer on the side opposite from the semiconductor substrate. When the circuit layer is viewed from above (e.g., a plan view to the surface to the circuit layer), the first electrode layer has a first facing portion that faces the second electrode layer in the thickness direction and a first non-facing portion not facing the second electrode layer, and the second electrode layer has a second facing portion that faces the first electrode layer in the thickness direction and a second non-facing portion not facing the first electrode layer. The first outer electrode is disposed on a side of the second end surface of the semiconductor substrate relative to the second outer electrode, and a center of gravity of the first electrode layer is located on the side of the second end surface relative to a center of gravity of the second electrode layer. A ratio $P_1$ of an area of the first electrode layer to a second electrode layer non-formation region that is a region of the semiconductor substrate on the side of the second end surface relative to an end portion of the second facing portion on the side of the second end surface is 80% or more and 100% or less.

Further, according to another exemplary aspect, a semiconductor device is provided that includes a semiconductor substrate having a first main surface and a second main surface opposite to each other in a thickness direction, a first end surface and a second end surface opposite to each other in a length direction orthogonal to the thickness direction, a first side surface and a second side surface opposite to each other in a width direction orthogonal to the thickness direction and the length direction; and a circuit layer disposed on the first main surface of the semiconductor substrate. The circuit layer includes a first electrode layer provided on a side of the semiconductor substrate, a dielectric layer provided on the first electrode layer, a second electrode layer provided on the dielectric layer, a first outer electrode electrically connected to the first electrode layer and extended to a surface of the circuit layer on a side opposite from the semiconductor substrate, and a second outer electrode electrically connected to the second electrode layer and extended to the surface of the circuit layer on the side opposite from the semiconductor substrate. When the circuit layer is viewed from above (e.g., a plan view to the surface to the circuit layer), the first electrode layer has a first facing portion that faces the second electrode layer in the thickness direction and a first non-facing portion not facing the second electrode layer, the second electrode layer has a second facing portion that faces the first electrode layer in the thickness direction and a second non-facing portion not facing the first electrode layer, and a maximum length of the first non-facing portion in the width direction is longer than an average length of the first facing portion in the width direction.

Moreover, in an exemplary aspect, a module is provided that includes the semiconductor device, a first land electrically connected to the first outer electrode, and a second land electrically connected to the second outer electrode.

According to the exemplary embodiments of the present invention, a low-loss semiconductor device and a module may be provided.

DETAILED DESCRIPTION OF EMBODIMENTS

Hereinafter, a semiconductor device and a module of the present invention will be explained.

However, it is noted that the exemplary embodiments are not limited to the following configurations and may appropriately be changed without departing from the gist of the present invention and applied. It is also noted that combinations of two or more of the exemplary configurations of the present invention described below are also included in the present invention.

[Semiconductor Device]

A semiconductor device is provided that includes a semiconductor substrate having a first main surface and a second main surface opposite to each other in a thickness direction, a first end surface and a second end surface opposite to each other in a length direction orthogonal to the thickness direction, a first side surface and a second side surface opposite to each other in a width direction orthogonal to the thickness direction and the length direction; and a circuit layer disposed on the first main surface of the semiconductor substrate. The circuit layer includes a first electrode layer provided on a side of the semiconductor substrate, a dielectric layer provided on the first electrode layer, a second electrode layer provided on the dielectric layer, a first outer electrode electrically connected to the first electrode layer and extended to a surface of the circuit layer on a side opposite from the semiconductor substrate, and a second outer electrode electrically connected to the second electrode layer and extended to the surface of the circuit layer on the side opposite from the semiconductor substrate. Moreover, when the circuit layer is viewed from above, the first electrode layer has a first facing portion facing the second electrode layer in the thickness direction and a first non-facing portion not facing the second electrode layer, and the second electrode layer has a second facing portion facing the first electrode layer in the thickness direction and a second non-facing portion not facing the first electrode layer.

An example of a first exemplary embodiment of the semiconductor device will be explained with reference to FIG. 1 and FIG. 2.

Figure 1:
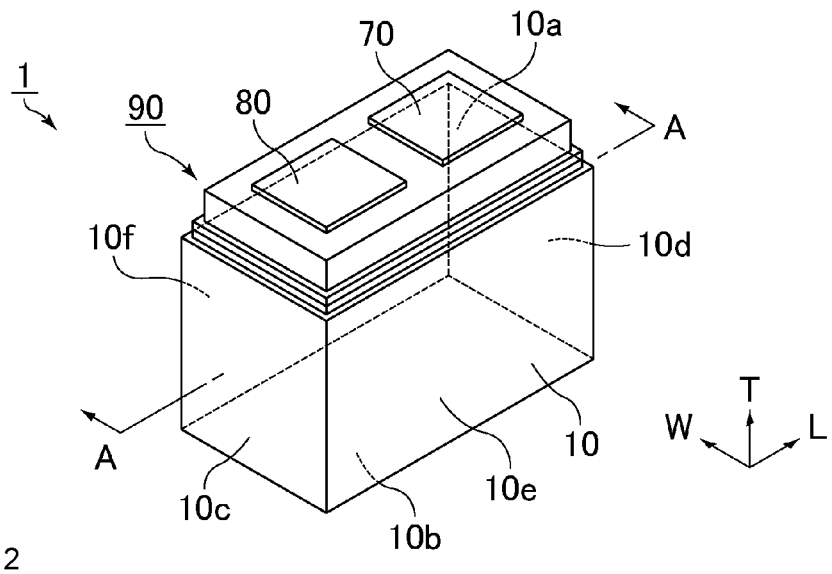
FIG. 1 is a perspective view schematically illustrating a first exemplary embodiment of a semiconductor device.
Figure 2:
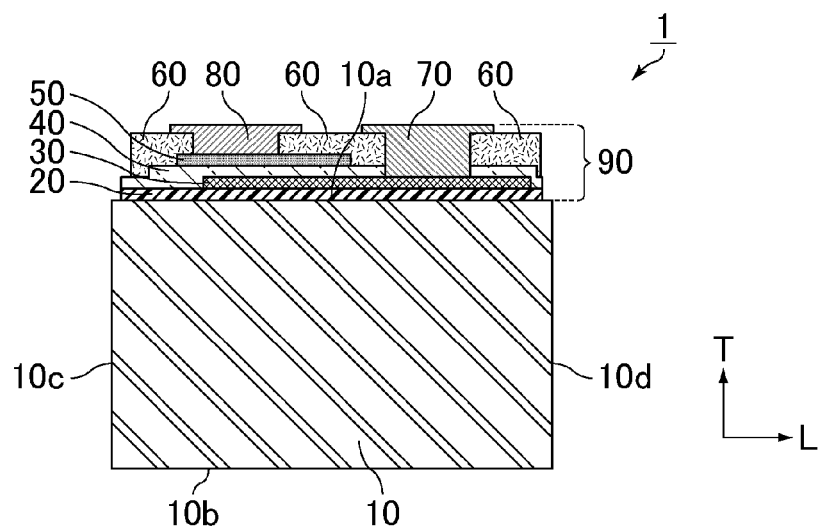
FIG. 2 is a sectional view taken along line A-A in FIG. 1.

FIG. 1 is a perspective view schematically illustrating the first exemplary embodiment of the semiconductor device, and FIG. 2 is a sectional view taken along line A-A in FIG. 1.

As illustrated in FIG. 1, a semiconductor device 1 includes a semiconductor substrate 10 and a circuit layer 90.

The semiconductor substrate 10 has a first main surface 10a and a second main surface 10b opposite to each other in a thickness direction (e.g., the T direction), a first end surface 10c and a second end surface 10d opposite to each other in a length direction (e.g., the L direction) orthogonal to the thickness direction (e.g., the T direction), and a first side surface 10e and a second side surface 10f opposite to each other in a width direction (e.g., the W direction) orthogonal to the thickness direction (e.g., the T direction) and the length direction (e.g., the L direction).

For purposes of the present description, a section of the semiconductor device 1 or the semiconductor substrate 10 parallel to the length direction (i.e., the L direction) and the thickness direction (i.e., the T direction) is referred to as an LT section. Further, a section of the semiconductor device 1 or the semiconductor substrate 10 parallel to the width direction (i.e., the W direction) and the thickness direction (i.e., the T direction) is referred to as a WT section. Furthermore, a section of the semiconductor device 1 or the semiconductor substrate 10 parallel to the length direction (i.e., the L direction) and the width direction (i.e., the W direction) is referred to as an LW section.

The circuit layer 90 is provided (or otherwise disposed) on the first main surface 10a of the semiconductor substrate 10, and a first outer electrode 70 and a second outer electrode 80 are exposed on a surface on a side opposite from a side of the semiconductor substrate 10.

The first outer electrode 70 is provided on a side of the second end surface 10*d* of the semiconductor substrate 10, and the second outer electrode 80 is provided on a side of the first end surface 10*c* of the semiconductor substrate 10.

As illustrated in FIG. 2, the circuit layer 90 forming the semiconductor device 1 includes an insulation layer 20 provided on a side of the first main surface 10*a* of the semiconductor substrate 10, a first electrode layer 30 provided on the insulation layer 20, a dielectric layer 40 provided on the first electrode layer 30, a second electrode layer 50 provided on the dielectric layer 40, the first outer electrode 70 electrically connected to the first electrode layer 30 and extended to (e.g., in the thickness direction T) the surface of the circuit layer 90 on the side opposite from the side of the semiconductor substrate 10, and the second outer electrode 80 electrically connected to the second electrode layer 50 and extended to (e.g., in the thickness direction T) the surface of the circuit layer 90 on the side opposite from the side of the semiconductor substrate 10.

A protection layer 60 is provided on a surface of the dielectric layer 40 and on part of a surface of the second electrode layer 50.

The insulation layer 20 is provided between the first main surface 10*a* of the semiconductor substrate 10 and the first electrode layer 30.

In FIG. 1 and FIG. 2, a region where the circuit layer 90 is not formed is present on part of the first main surface 10*a* of the semiconductor substrate 10. However, in an alternative aspect of the semiconductor device, the circuit layer can be formed on an entire first main surface of the semiconductor substrate.

An example of shapes of a semiconductor substrate, a first electrode layer, and a second electrode layer, and a positional relationship therebetween in the first exemplary embodiment of the semiconductor device will be explained with reference to FIG. 3.

Figure 3:
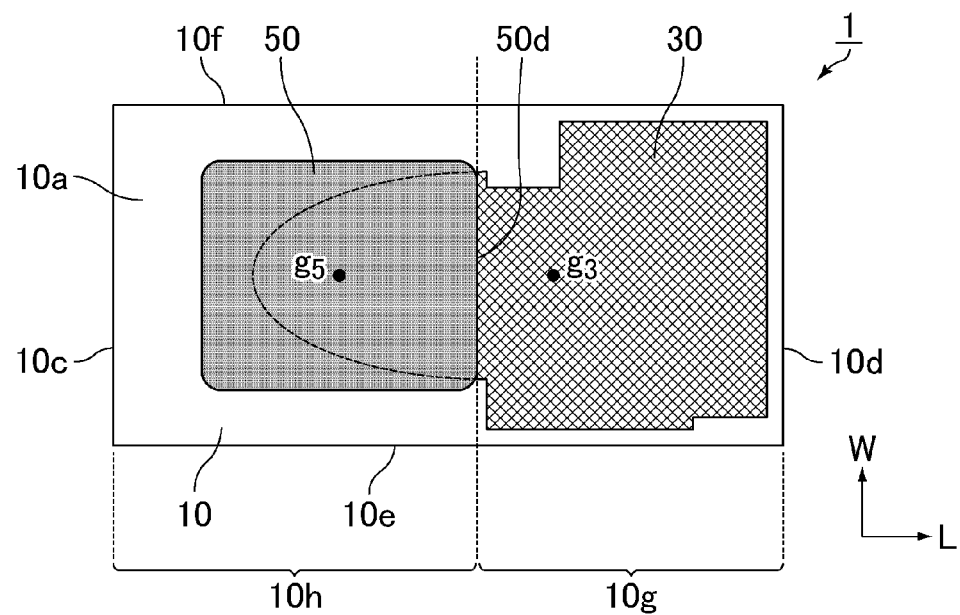
FIG. 3 is a plan view illustrating a positional relationship between a semiconductor substrate, a first electrode layer, and a second electrode layer of the semiconductor device in FIG. 1 and FIG. 2.

FIG. 3 is a plan view illustrating a positional relationship between a semiconductor substrate, a first electrode layer, and a second electrode layer of the semiconductor device illustrated in FIG. 1 and FIG. 2. FIG. 3 is a view illustrating a positional relationship between the first main surface 10*a* of the semiconductor substrate 10, the first electrode layer 30, and the second electrode layer 50 when the circuit layer 90 of the semiconductor device 1 illustrated in FIG. 1 and FIG. 2 is viewed from above.

As illustrated in FIG. 3, the first electrode layer 30 and the second electrode layer 50 are provided on the semiconductor substrate 10. As noted above, the first electrode layer 30 and the second electrode layer 50 are facing each other with a dielectric layer (not illustrated) interposed therebetween.

In the exemplary aspect, a shape of the first electrode layer 30 is a combination of part of a substantial ellipse and a polygon. Moreover, the shape of the second electrode layer 50 is a rectangle with rounded corners in the exemplary aspect.

A center of gravity $g_3$ of the first electrode layer 30 is located on the side of the second end surface 10*d* of the semiconductor substrate 10 relative to a center of gravity $g_5$ of the second electrode layer 50. This is because, as illustrated in FIG. 1 and FIG. 2, the first outer electrode 70 electrically connected to the first electrode layer 30 is disposed on the side of the second end surface 10*d* of the semiconductor substrate 10, and the second outer electrode 80 electrically connected to the second electrode layer 50 is disposed on the side of the first end surface 10*c* of the semiconductor substrate 10.

It is noted that a region where the semiconductor substrate 10 is provided may be divided, based on a position where the second electrode layer 50 is disposed, into a second electrode layer non-formation region 10*g* and a region 10*h* other than the second electrode layer non-formation region. The region where the semiconductor substrate 10 is provided corresponds to a region where the first main surface 10*a* of the semiconductor substrate 10 is provided when the circuit layer 90 is viewed from above, and the first side surface, the second side surface, the first end surface, the second end surface, and the second main surface, which are surfaces other than the first main surface 10*a* of the semiconductor substrate 10, are not considered.

The second electrode layer non-formation region 10*g* is a region where the semiconductor substrate 10 is provided and is a region on the side of the second end surface 10*d* of the semiconductor substrate 10 relative to an end portion 50*d* on the side of the second end surface 10*d* of a portion of the second electrode layer 50 facing the first electrode layer 30.

Moreover, the region 10*h* other than the second electrode layer non-formation region is a region where the semiconductor substrate 10 is provided and is a region other than the second electrode layer non-formation region 10*g*. It should also be appreciated that the region 10*h* other than the second electrode layer non-formation region is a region from the end portion 50*d* on the side of the second end surface 10*d* of the portion of the second electrode layer 50 facing the first electrode layer 30 to an end portion on the side of the first end surface 10*c* of the semiconductor substrate 10.

Figure 4:
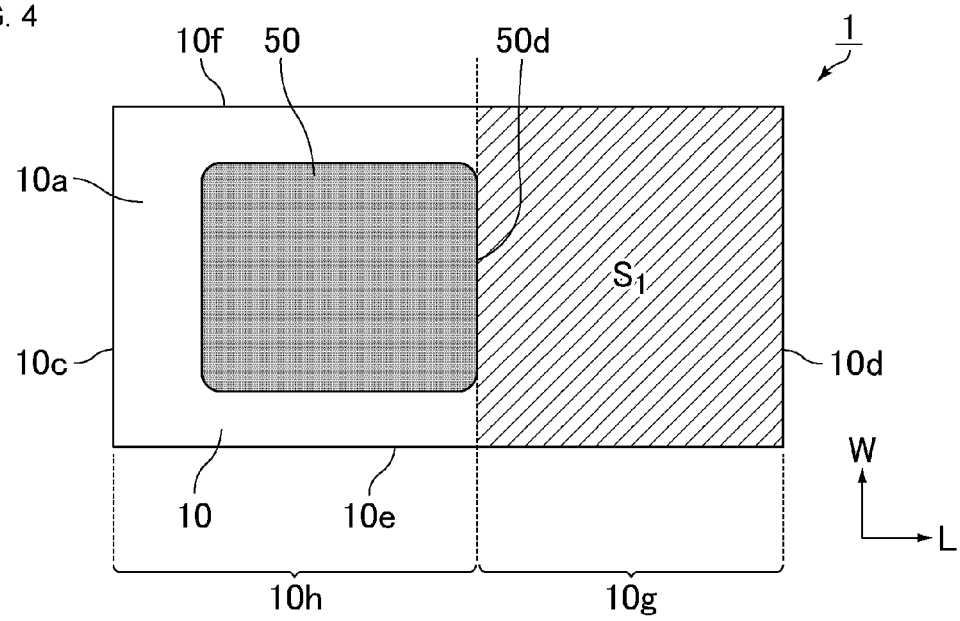
FIG. 4 is a plan view of a second electrode layer non-formation region in FIG. 3.
Figure 5:
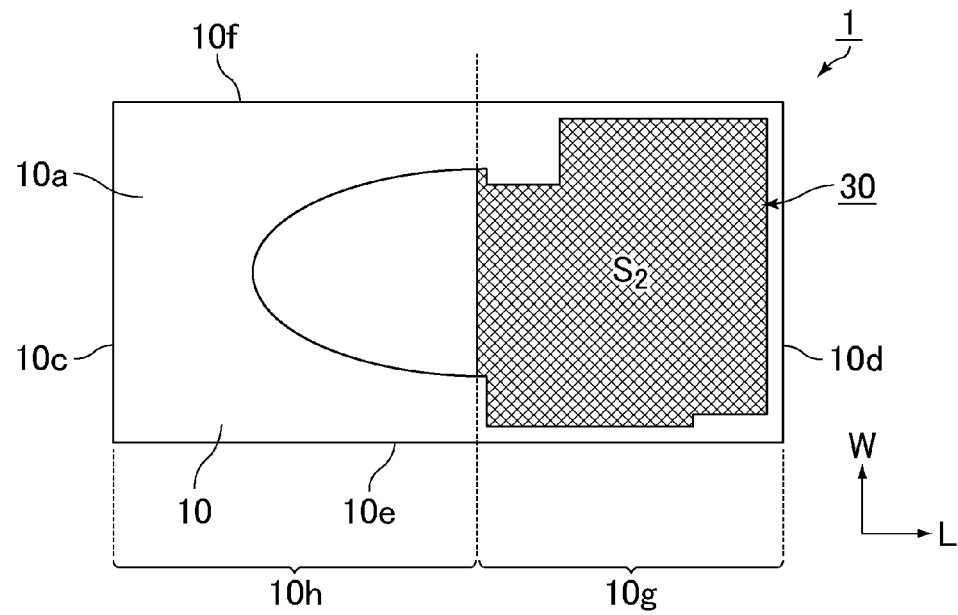
FIG. 5 is a plan view of the first electrode layer provided in the second electrode layer non-formation region in FIG. 3.

FIG. 4 is a plan view of the second electrode layer non-formation region in FIG. 3, and FIG. 5 is a plan view of the first electrode layer provided in the second electrode layer non-formation region in FIG. 3.

As illustrated in FIG. 4, an area of the second electrode layer non-formation region 10*g* (area of region indicated by diagonal lines) is $S_1$.

As illustrated in FIG. 5, an area of the first electrode layer 30 in the second electrode layer non-formation region 10*g* (area of region indicated by cross hatching lines) is $S_2$.

The ratio of the area $S_2$ of the first electrode layer 30 in the second electrode layer non-formation region 10*g* to the area $S_1$ of the second electrode layer non-formation region 10*g* expressed with $[P_1=(S_2/S_1)\times 100][\%]$ is 80%.

Effects of the first exemplary embodiment of the semiconductor device will be explained in comparison with FIG. 6.

Figure 6:
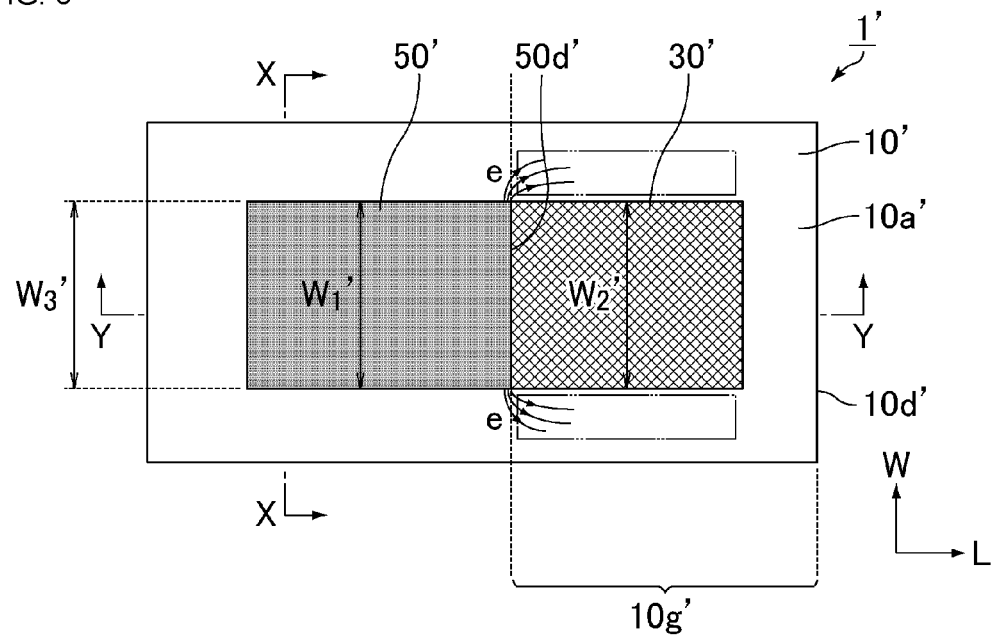
FIG. 6 is a plan view schematically illustrating an example of a semiconductor device known in the related art.

FIG. 6 is a plan view schematically illustrating an example of a semiconductor device known in the related art.

In a semiconductor device 1' illustrated in FIG. 6, a first electrode layer 30' having a substantially rectangular shape in a plan view and a second electrode layer 50' having a substantially rectangular shape in a plan view are disposed on a first main surface 10*a*' of a semiconductor substrate 10' to face each other with a dielectric layer (not illustrated) interposed therebetween.

As illustrated in FIG. 6, each of the first electrode layer 30' and the second electrode layer 50' has a rectangular shape with a constant length in the width direction. In the width direction, the maximum length $W_1'$ of the first electrode layer 30' in a region where the first electrode layer 30' and the second electrode layer 50' face each other (e.g., a first facing portion) is equal to the maximum length $W_2'$ of the first electrode layer 30' in a region of the first electrode layer 30' not facing the second electrode layer 50' (e.g., a first non-facing portion). Further, the maximum length $W_3'$ of the second electrode layer 50' in the width direction is also equal to $W_1'$ and $W_2'$. Since the lengths of the first electrode layer 30' and the second electrode layer 50' in the width direction are constant, no relatively narrow region nor relatively wide region is present. Furthermore, since the lengths in the width direction are constant, the maximum length $W_1$ of the first facing portion in the width direction, the maximum length $W_2$ of the first non-facing portion in the width direction, and the maximum length $W_3$ of the second electrode layer 50 in the width direction are respectively equal to an average length of the first facing portion in the width direction, an average length of the first non-facing portion in the width direction, and an average length of the second electrode layer in the width direction. Further, the entirety of the second electrode layer 50' faces the first electrode layer 30'. With this, the second electrode layer 50' does not have a region not facing the first electrode layer 30'.

In a region of the semiconductor substrate 10', in a second electrode layer non-formation region 10g' from an end portion 50d' on a side of a second end surface 10d' of a portion where the second electrode layer 50' and the first electrode layer 30' face each other to the second end surface 10d' of the semiconductor substrate 10', a region where the first electrode layer 30' is not provided (i.e., the region surrounded by broken line in FIG. 6, for example) is present. Consequently, in the region where the first electrode layer 30' is not disposed, electric lines of force e are generated between the semiconductor substrate 10' and the second electrode layer 50'.

In contrast, in the exemplary aspect where the ratio $P_1$ of the area of the first electrode layer 30 to the second electrode layer non-formation region 10g is between 80% and 100%, 80% or more of the electric lines of force generated between the second electrode layer 50 and the semiconductor substrate 10 can be shielded in the second electrode layer non-formation region 10g. As a result, the configuration of the exemplary aspect suppresses conductor loss.

It is noted that directions of the electric lines of force e illustrated in FIG. 6 do not specify polarity of the semiconductor device. This also applies to the semiconductor device of the present invention and FIG. 8 and FIG. 11 to be described later.

Next, the sizes and positions of the first electrode layer and the second electrode layer in the width direction in the first exemplary embodiment of the semiconductor device will be explained.

Figure 7:
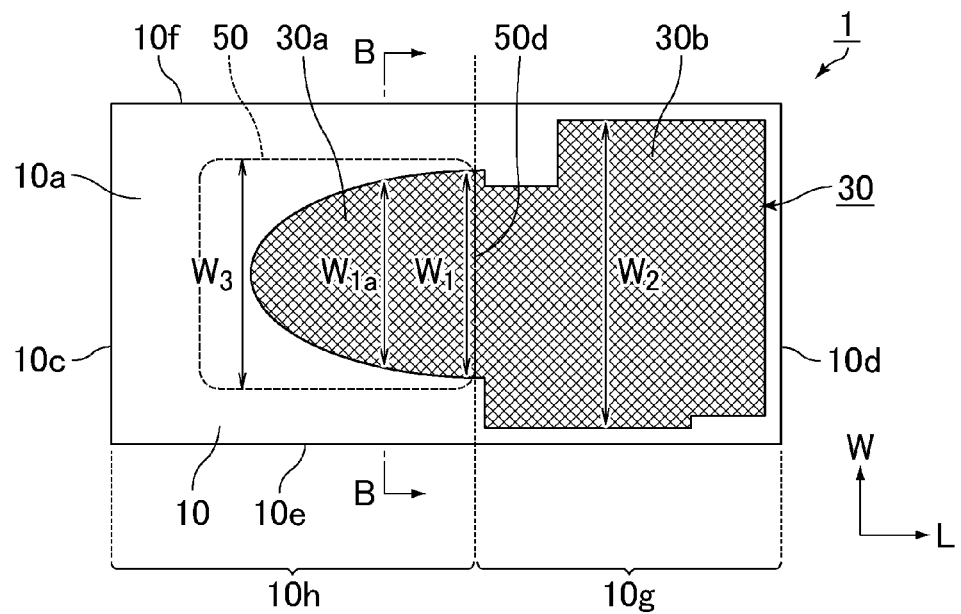
FIG. 7 is a plan view explaining a relationship between lengths in a width direction of the first electrode layer and the second electrode layer in FIG. 3.

FIG. 7 is a plan view explaining a relationship between lengths in the width direction of the first electrode layer and the second electrode layer in FIG. 3. Note that, in FIG. 7, the position where the second electrode layer 50 is provided is indicated by a broken line.

As illustrated in FIG. 7, the first electrode layer 30 has a first facing portion 30a that faces (e.g., overlaps in the thickness direction T) the second electrode layer 50 and a first non-facing portion 30b that does not face (e.g., does not overlap in the thickness direction T) the second electrode layer 50.

A maximum length of the first facing portion 30a in the width direction is the length indicated by a double-headed arrow $W_1$, and an average length of the first facing portion 30a in the width direction is the length indicated by a double-headed arrow $W_{1a}$. Further, a maximum length of the first non-facing portion 30b in the width direction is a length indicated by a double-headed arrow $W_2$.

The maximum length $W_2$ of the first non-facing portion 30b in the width direction is preferably longer than the maximum length $W_1$ of the first facing portion 30a in the width direction. When $W_2$ is longer than $W_1$, the electric lines of force generated between the second electrode layer 50 and the semiconductor substrate 10 are shielded by a portion of the first non-facing portion 30b where the length in the width direction is maximum.

The maximum length $W_2$ of the first non-facing portion 30b in the width direction is preferably longer than the average length $W_{1a}$ of the first facing portion 30a in the width direction. In a case that $W_2$ is longer than $W_{1a}$, the electric lines of force generated between the second electrode layer 50 and the semiconductor substrate 10 are easily shielded by the first non-facing portion 30b.

It is also noted that the average length of the first facing portion in the width direction is the length of a short side of a rectangle having a long side with the same length as the maximum length of the first facing portion in the length direction and having the same area. The average length of the first facing portion in the width direction may also be obtained by dividing the area of the first facing portion by the maximum length of the first facing portion in the length direction.

It is further noted that the average length of the first non-facing portion in the width direction and the average length of the second electrode layer in the width direction may also be obtained with the same method as in the case of the first facing portion.

In the first exemplary embodiment of the semiconductor device, the maximum length of the first facing portion in the width direction is preferably shorter than a maximum length of the second electrode layer in the width direction.

When the maximum length of the first facing portion in the width direction is shorter than the maximum length of the second electrode layer in the width direction, among electric lines of force generated between the first electrode layer and a conductor, such as a land electrically connected to the second electrode layer, electric lines of force generated in a curved manner along the width direction may be shielded by the second electrode layer. Thus, conductor loss is suppressed according to this configuration.

An example of shielding electric lines of force generated in a curved manner along the width direction will be explained with reference to FIG. 8 and FIG. 9.

Figure 8:
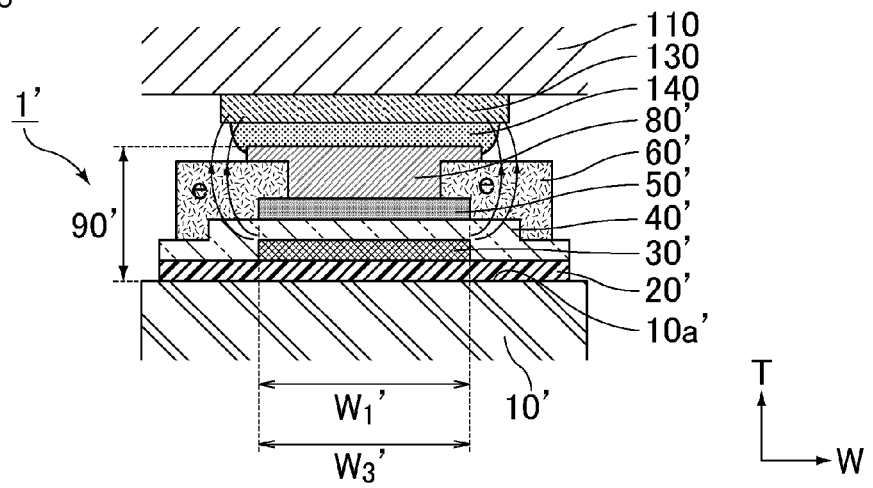
FIG. 8 is a sectional view taken along line X-X in FIG. 6 and schematically illustrates a state of electric lines of force when the semiconductor device is mounted on a mounting substrate.

FIG. 8 is a sectional view taken along line X-X in FIG. 6 and schematically illustrates a state of electric lines of force when the semiconductor device is mounted on a mounting substrate.

As illustrated in FIG. 8, a circuit layer 90' provided on the first main surface 10a' of the semiconductor substrate 10' is constituted of an insulation layer 20', the first electrode layer 30' provided on the insulation layer 20', a dielectric layer 40' provided on the first electrode layer 30', the second electrode layer 50' provided on the dielectric layer 40', a first outer electrode (not illustrated) electrically connected to the first electrode layer 30' and extended to a surface of the circuit layer 90' on the side opposite from the semiconductor substrate 10', a second outer electrode 80' electrically connected to the second electrode layer 50' and extended to the surface of the circuit layer 90' on the side opposite from the semiconductor substrate 10', and a protection layer 60' covering part of the dielectric layer 40' and part of the second electrode layer 50'. The second outer electrode 80' is connected to a second land 130 disposed on a mounting substrate 110 with solder 140. Although not illustrated, the first outer electrode is also connected to a first land disposed on the mounting substrate with solder.

As illustrated in FIG. 8, when the average length $W_1'$ of the first electrode layer 30' corresponding to the first facing portion is equal to the maximum length $W_3'$ of the second electrode layer 50', a region not facing the first electrode layer 30' (second non-facing portion) is not formed in the second electrode layer 50'. In such a case, the electric lines of force e generated in a curved manner along the width direction are generated between the first electrode layer 30' and a conductor, such as a land electrically connected to the second electrode layer 50', and cause conductor loss in this design.

Figure 9:
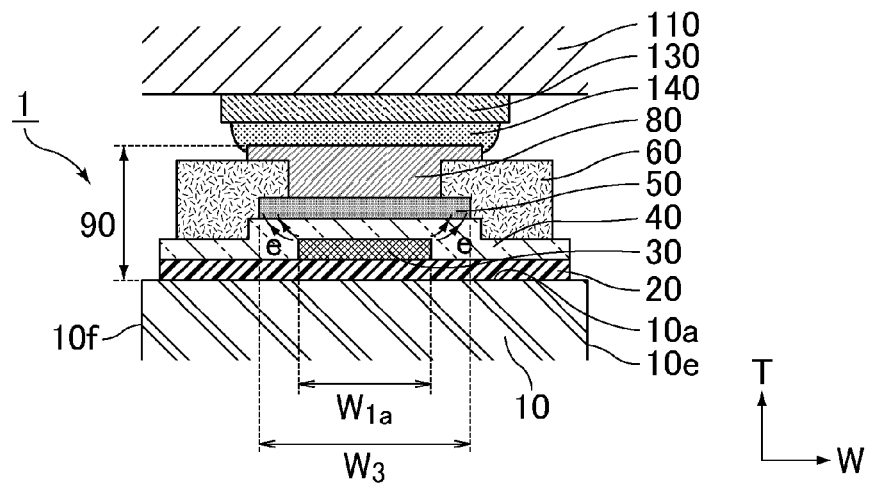
FIG. 9 is a sectional view taken along line B-B in FIG. 7 and schematically illustrates a state of electric lines of force when the semiconductor device is mounted on a mounting substrate.

FIG. 9 is a sectional view taken along line B-B in FIG. 7 and schematically illustrates a state of electric lines of force when the semiconductor device is mounted on a mounting substrate.

The semiconductor device 1 is mounted on the mounting substrate 110 with the second outer electrode 80 being connected to the second land 130 with the solder 140.

As shown in FIG. 9, the maximum length $W_3$ of the second electrode layer 50 in the width direction is longer than the average length $W_{1a}$ of the first facing portion 30a in the width direction. Consequently, the electric lines of force e generated in a curved manner along the width direction between the first electrode layer 30 and a conductor, such as the second land 130 electrically connected to the second electrode layer, are shielded by the second electrode layer 50. Thus, conductor loss is suppressed according to this configuration of the exemplary embodiment.

Next, sizes and positions of the first electrode layer and the second electrode layer in the length direction in the first exemplary embodiment of the semiconductor device will be explained.

Figure 10:
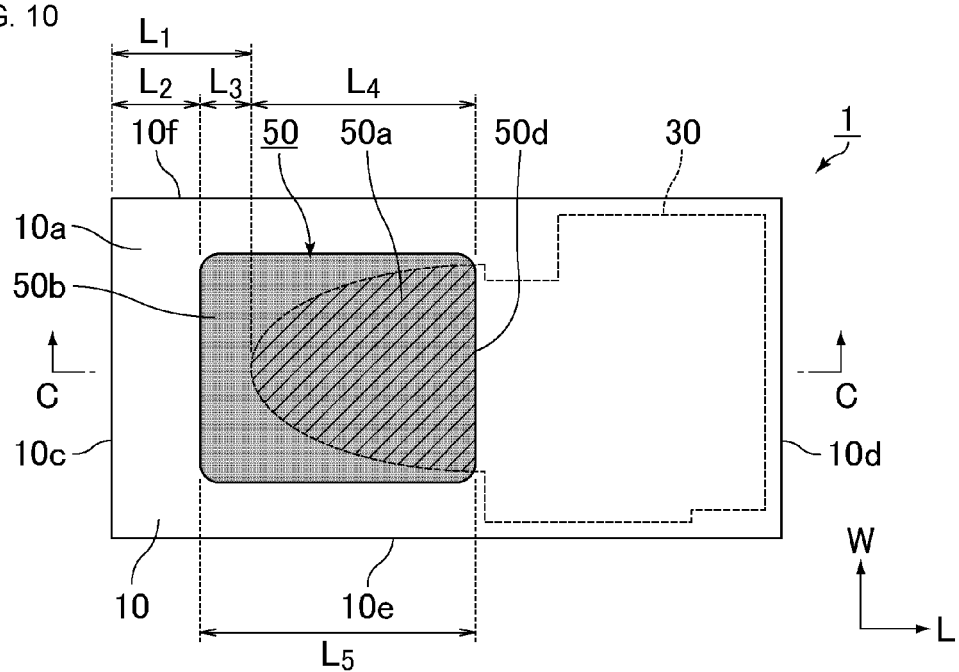
FIG. 10 is a plan view explaining a relationship between lengths in a length direction of the first electrode layer and the second electrode layer in FIG. 3.

FIG. 10 is a plan view explaining a relationship between lengths in the length direction of the first electrode layer and the second electrode layer in FIG. 3. Note that, in FIG. 10, a position where the first electrode layer 30 is provided is indicated by a broken line.

As illustrated in FIG. 10, the second electrode layer 50 has a second facing portion 50a that faces the first electrode layer 30 (e.g., in the thickness direction T) and a second non-facing portion 50b that does not face the first electrode layer 30 (e.g., in the thickness direction T). In other words, the second facing portion 50a overlaps the first facing portion 30a in the plan view.

Since the second non-facing portion 50b not facing the first electrode layer 30 is provided in the second electrode layer 50, electric lines of force generated between the first electrode layer 30 facing the second electrode layer 50 and a conductor, such as a land electrically connected to the second electrode layer 50, are shielded. Thus, conductor loss is reduced.

The second electrode layer non-formation region may also be referred to a region on the side of the second end surface 10d of the semiconductor substrate 10 relative to the end portion 50d of the second facing portion 50a on the side of the second end surface 10d.

In the semiconductor device illustrated in FIG. 10, in the length direction, a shortest distance from the first end surface 10c of the semiconductor substrate 10 to the first electrode layer 30 (e.g., the length indicated by double-headed arrow $L_1$ in FIG. 10) is longer than the shortest distance from the first end surface 10c of the semiconductor substrate 10 to the second electrode layer 50 (e.g., the length indicated by double-headed arrow $L_2$ in FIG. 10). A distance from an end portion of the first electrode layer 30 on the side of the first end surface 10c to an end portion of the second electrode layer 50 on the side of the first end surface 10c in the length direction is denoted with $L_3$. With this, the second electrode layer 50 protrudes from the first electrode layer 30 toward the side of the first end surface 10c of the semiconductor substrate 10 by the distance $L_3$. A length of the second electrode layer 50 in the length direction (e.g., the length indicated by double-headed arrow $L_5$ in FIG. 10) is longer than a length of the second facing portion 50a (e.g., the length indicated by double-headed arrow $L_4$ in FIG. 10).

In the first exemplary embodiment of the semiconductor device, the shortest distance from the first end surface of the semiconductor substrate to the first electrode layer in the length direction is preferably longer than the shortest distance from the first end surface of the semiconductor substrate to the second electrode layer in the length direction.

When the shortest distance from the first end surface of the semiconductor substrate to the first electrode layer in the length direction is longer than the shortest distance from the first end surface of the semiconductor substrate to the second electrode layer in the length direction, among electric lines of force generated between the first electrode layer and a conductor, such as a land electrically connected to the second electrode layer, the electric lines of force generated in a curved manner along the length direction of the semiconductor substrate are shielded by the second electrode layer. Thus, conductor loss is suppressed according to this configuration.

An example of shielding the electric lines of force generated in a curved manner along the length direction will be explained with reference to FIG. 11 and FIG. 12.

Figure 11:
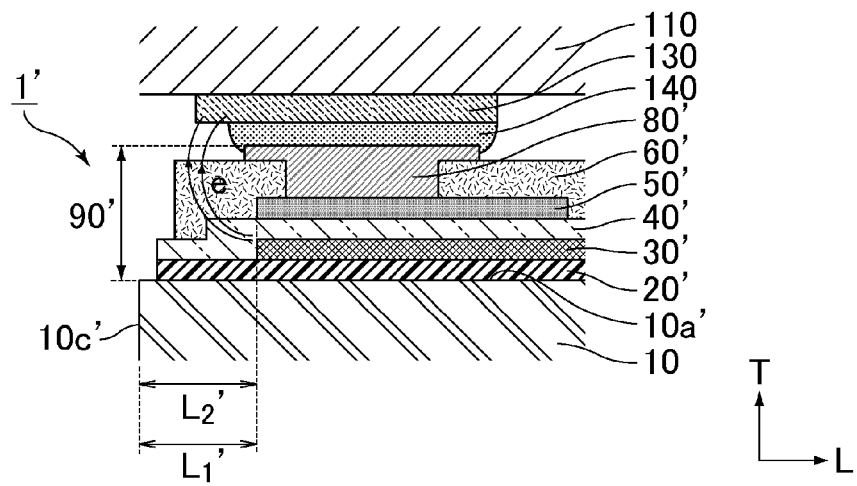
FIG. 11 is a sectional view taken along line Y-Y in FIG. 6 and schematically illustrates a state of electric lines of force when the semiconductor device is mounted on a mounting substrate.

FIG. 11 is a sectional view taken along line Y-Y in FIG. 6 and schematically illustrates a state of electric lines of force when the semiconductor device is mounted on a mounting substrate. It is noted that FIG. 11 is a view of a periphery of the semiconductor substrate on the side of the first end surface in the sectional view taken along line Y-Y in FIG. 6.

In the semiconductor device 1' illustrated in FIG. 11, the shortest distance $L_1'$ from a first end surface 10c' of the semiconductor substrate 10' to the first electrode layer 30' and the shortest distance $L_2'$ from the first end surface 10c' to the second electrode layer 50' are equal to each other. With this design, it may be said that the second electrode layer 50' does not protrude toward the side of the first end surface 10c' of the semiconductor substrate 10' relative to the first electrode layer 30', i.e., the protrusion amount in the L direction is zero. Consequently, it is not possible to shield, by the second electrode layer 50', the electric lines of force e generated in a curved manner along the length direction between the first electrode layer 30' and the second land 130 connected to the second electrode layer 50'.

Figure 12:
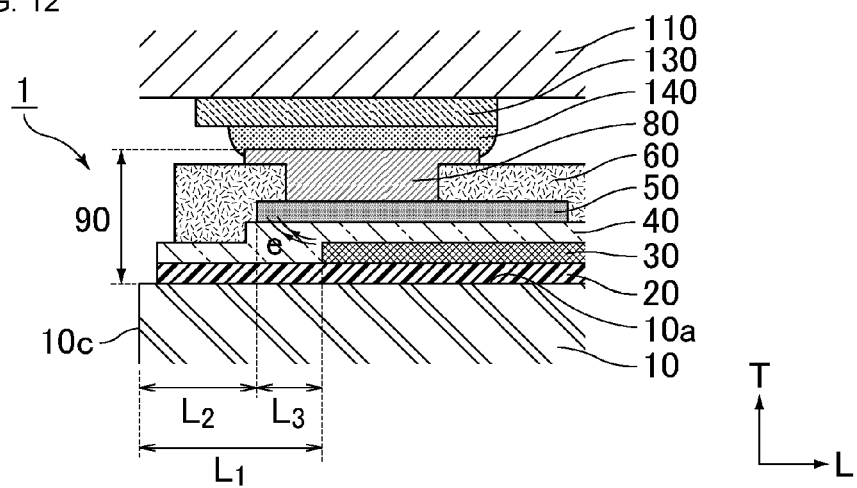
FIG. 12 is a sectional view taken along line C-C in FIG. 10 and schematically illustrates a state of electric lines of force when the semiconductor device is mounted on a mounting substrate.

FIG. 12 is a sectional view taken along line C-C in FIG. 10 and schematically illustrates a state of electric lines of force when the semiconductor device is mounted on a mounting substrate. It is noted that FIG. 12 is a view of a periphery of the semiconductor substrate on the side of the first end surface in the sectional view taken along line C-C in FIG. 10.

In the semiconductor device 1 in FIG. 12, the second electrode layer 50 protrudes towards (i.e., extends in the L direction) the side of the first end surface 10c relative to the first electrode layer 30 by the distance $L_3$. When the second electrode layer 50 protrudes toward the side of the first end surface 10c relative to the first electrode layer 30, when the semiconductor device 1 is mounted on a mounting substrate and a voltage is applied, the electric lines of force generated in a curved manner along the length direction between the first electrode layer 30 and the second land 130 electrically connected to the second electrode layer 50 are shielded by the second electrode layer 50. Thus, conductor loss is suppressed according to this exemplary configuration.

The distance $L_3$ is preferably 5 µm or more and 20 µm or less, for example.

Next, a second exemplary embodiment of the semiconductor device will be explained.

In the second exemplary embodiment of a semiconductor, the maximum length of the first non-facing portion in the width direction is longer than the average length of the first facing portion in the width direction.

When the maximum length of the first non-facing portion in the width direction is longer than the average length of the first facing portion in the width direction, increased is the effect of shielding electric lines of force generated between a second electrode layer and a semiconductor substrate by the first non-facing portion. Thus, conductor loss can be suppressed in this exemplary embodiment.

Figure 13:
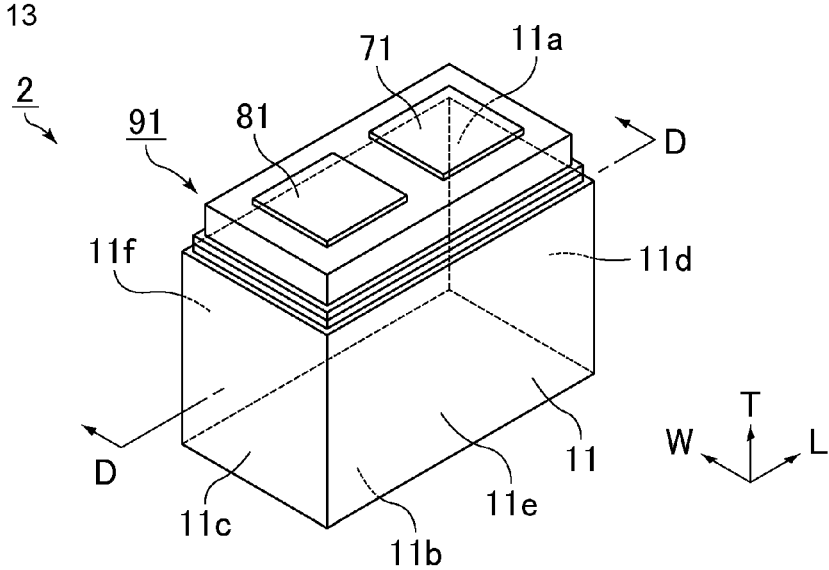
FIG. 13 is a perspective view schematically illustrating a second exemplary embodiment of the semiconductor device.

FIG. 13 is a perspective view schematically illustrating the second exemplary embodiment of the semiconductor device.

As illustrated in FIG. 13, a semiconductor device 2 includes a semiconductor substrate 11 and a circuit layer 91.

In general, the semiconductor substrate 11 has a first main surface 11a and a second main surface 11b opposite to each other in the thickness direction (e.g., in the T direction), a first end surface 11c and a second end surface 11d opposite to each other in the length direction (e.g., in the L direction) orthogonal to the thickness direction (e.g., in the T direction), and a first side surface 11e and a second side surface 11f opposite to each other in the width direction (e.g., in the W direction) orthogonal to the thickness direction (e.g., in the T direction) and the length direction (e.g., in the L direction).

The circuit layer 91 is provided (or otherwise disposed) on the first main surface 11a of the semiconductor substrate 11, and a first outer electrode 71 and a second outer electrode 81 are exposed on a surface on a side opposite from a side of the semiconductor substrate 11.

The first outer electrode 71 is provided on the side of the second end surface 11d of the semiconductor substrate 11, and the second outer electrode 81 is provided on the side of the first end surface 11c of the semiconductor substrate 11.

Figure 14:
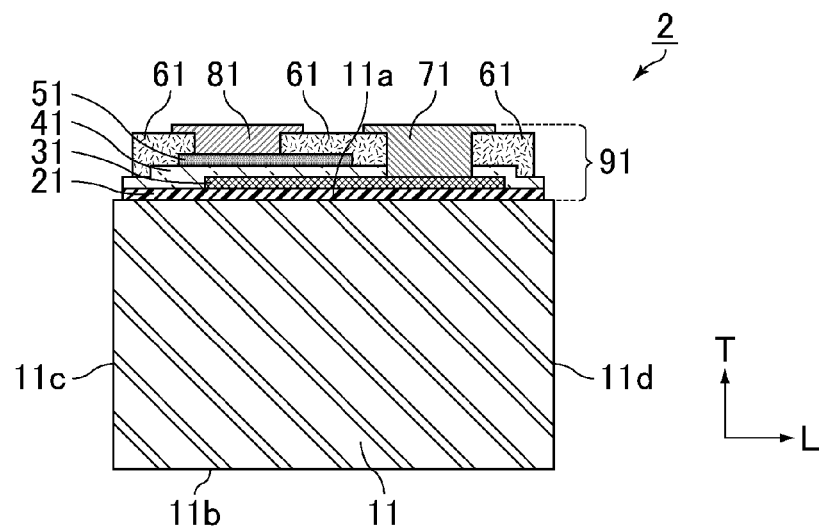
FIG. 14 is a sectional view taken along line D-D in FIG. 13.

FIG. 14 is a sectional view taken along line D-D in FIG. 13.

As illustrated in FIG. 14, the circuit layer 91 forming the semiconductor device 2 includes an insulation layer 21 provided on a side of the first main surface 11a of the semiconductor substrate 11, a first electrode layer 31 provided on the insulation layer 21, a dielectric layer 41 provided on the first electrode layer 31, a second electrode layer 51 provided on the dielectric layer 41, the first outer electrode 71 electrically connected to the first electrode layer 31 and extended to a main surface of the circuit layer 91 on the side opposite from the side of the semiconductor substrate 11, and the second outer electrode 81 electrically connected to the second electrode layer 51 and extended to the surface of the circuit layer 91 on the side opposite from the side of the semiconductor substrate 11.

Moreover, a protection layer 61 is provided on a surface of the dielectric layer 41 and on part of a surface of the second electrode layer 51.

The insulation layer 21 is provided between the first main surface 11a of the semiconductor substrate 11 and the first electrode layer 31.

In FIG. 13 and FIG. 14, a region where the circuit layer 91 is not formed is present on part of the first main surface 11a of the semiconductor substrate 11. However, in an alternative aspect of the semiconductor device of the exemplary second embodiment, a circuit layer may be formed on an entire first main surface of a semiconductor substrate.

Examples of shapes of a semiconductor substrate, a first electrode layer, and a second electrode layer and a positional relationship therebetween in the second exemplary embodiment of the semiconductor device will be explained with reference to FIG. 15, FIG. 16, and FIG. 17.

Figure 15:
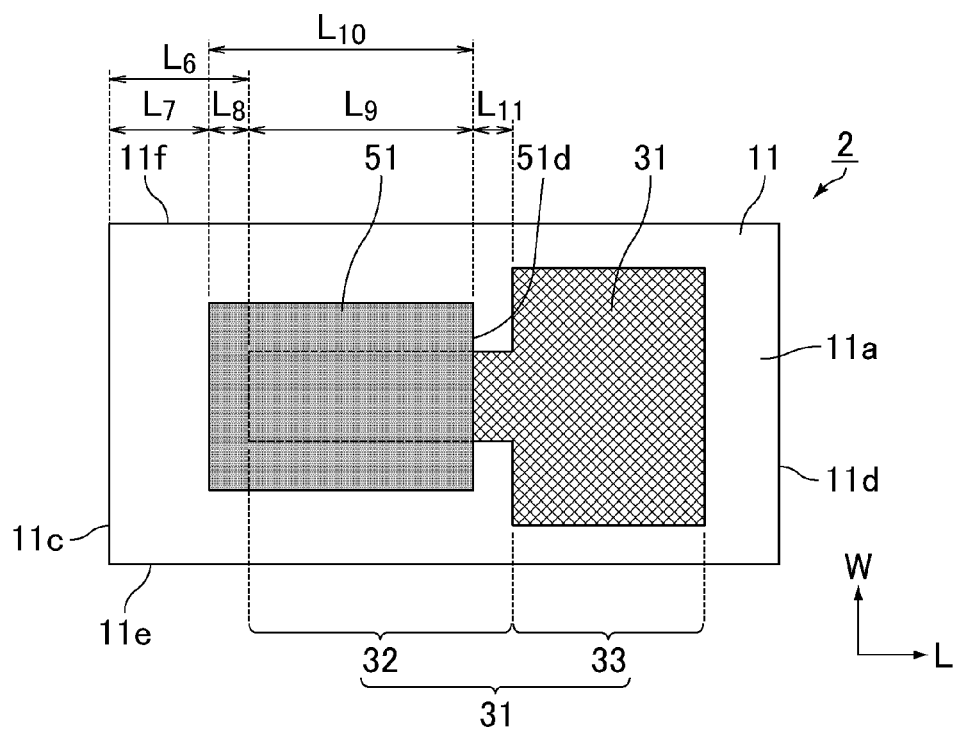
FIG. 15 is a plan view schematically illustrating an example of a positional relationship between a semiconductor substrate, a first electrode layer, and a second electrode layer in the semiconductor device in FIG. 13 and FIG. 14.

FIG. 15 is a plan view schematically illustrating an example of a positional relationship between a semiconductor substrate, a first electrode layer, and a second electrode layer in the semiconductor device in FIG. 13 and FIG. 14.

As illustrated in FIG. 15, the first electrode layer 31 and the second electrode layer 51 are provided on the semiconductor substrate 11. The first electrode layer 31 and the second electrode layer 51 are facing each other (e.g., overlapping each other in the thickness direction T) with a dielectric layer (not illustrated) interposed therebetween.

As shown, the first electrode layer 31 includes a narrow portion 32 that is provided on the side of the first end surface 11c of the semiconductor substrate 11 and that is relatively narrower than a wide portion 33 and includes the wide portion 33 that is provided on the side of the second end surface 11d of the semiconductor substrate 11 and that is relatively wider than the narrow portion 32. The narrow portion 32 and the wide portion 33 are placed continuously with each other along the length direction L. The narrow portion 32 has a substantially rectangular shape whose long sides extend along the length direction L, and the wide portion 33 has a substantially rectangular shape whose long sides extend along the width direction W. With this configuration, the first electrode layer 31 has a substantially T-shape (i.e., in a plan view) in which the narrow portion 32 having a substantially rectangular shape with long sides along the length direction L and the wide portion 33 having a substantially rectangular shape with long sides along the width direction W are continuously placed in a direction from the first end surface 11c toward the second end surface 11d of the semiconductor substrate 11. Whereas the second electrode layer 51 has a substantially rectangular shape in which the long sides extend along the length direction L.

As further shown, the narrow portion 32 is disposed on the side of the first end surface 11c of the semiconductor substrate 11 relative to the wide portion 33. This is because the narrow portion 32 is a portion facing the second electrode layer 51, and the second outer electrode 81 connected to the second electrode layer 51 is disposed on the side of the first end surface 11c relative to the first outer electrode 71.

At least part of the narrow portion 32 faces the second electrode layer 51, but the wide portion 33 of the first electrode layer 31 does not face the second electrode layer 51. Further, an end portion of the wide portion 33 of the first electrode layer 31 on the side of the first end surface 11c is provided at a position separated from the second electrode layer 51. That is, in the narrow portion 32 of the first electrode layer 31, a portion on the side of the second end surface 11d relative to an end portion 51d of the second electrode layer 51 on the side of the second end surface 11d does not face the second electrode layer 51.

In the length direction, the shortest distance from the first end surface 11c of the semiconductor substrate 11 to the first electrode layer 31 (e.g., the length indicated by double-headed arrow $L_6$ in FIG. 15) is longer than the shortest distance from the first end surface 11c of the semiconductor substrate 11 to the second electrode layer 51 (e.g., the length indicated by double-headed arrow $L_7$ in FIG. 15). Moreover, a distance from the end portion of the first electrode layer 31 on the side of the first end surface 11c to the end portion of the second electrode layer 51 on the side of the first end surface 11c in the length direction is denoted with Lg. With this configuration, the second electrode layer 51 protrudes (i.e., extends in the length direction L) from the first electrode layer 31 toward the side of the first end surface 11c of the semiconductor substrate 11 by the distance $L_8$. The length of the second electrode layer 51 in the length direction (e.g., the length indicated by double-headed arrow $L_{10}$ in FIG. 15) is longer than the length of a portion where the second electrode layer 51 and the first electrode layer 31 face each other (e.g., the length indicated by double-headed arrow $L_9$ in FIG. 15).

When the second electrode layer 51 protrudes toward the side of the first end surface 11c relative to the first electrode layer 31, when the semiconductor device 2 is mounted on a mounting substrate and a voltage is applied, among electric lines of force generated between the first electrode layer 31 and a conductor, such as a land electrically connected to the second electrode layer 51, part of the electric lines of force generated in a curved manner along the length direction of the semiconductor substrate 11 are shielded by the second electrode layer 51. Thus, conductor loss is suppressed in this configuration.

The distance $L_8$ is preferably 5 μm or more and 20 μm or less, for example.

A predetermined distance $L_{11}$ is provided between the second electrode layer 51 and the wide portion 33 of the first electrode layer.

The distance $L_{11}$ is preferably 0% or more and 10% or less of a length of the semiconductor device 1 in the length direction.

The shorter the distance $L_{11}$ is, the greater the effect of shielding, by the first electrode layer 31, the electric lines of force generated between the second electrode layer 51 and the semiconductor substrate 11 is. When the distance $L_{11}$ exceeds 10% of the length of the semiconductor substrate, in a portion where the second electrode layer 51 and the first electrode layer 31 face each other, in a region from the end portion 51d on the side of the second end surface 11d of the semiconductor substrate 11 to the wide portion 33, there may be a portion where electric lines of force generated between the second electrode layer 51 and the semiconductor substrate 11 are not able to be shielded. Thus, conductor loss may not sufficiently be suppressed in such a configuration.

Figure 16:
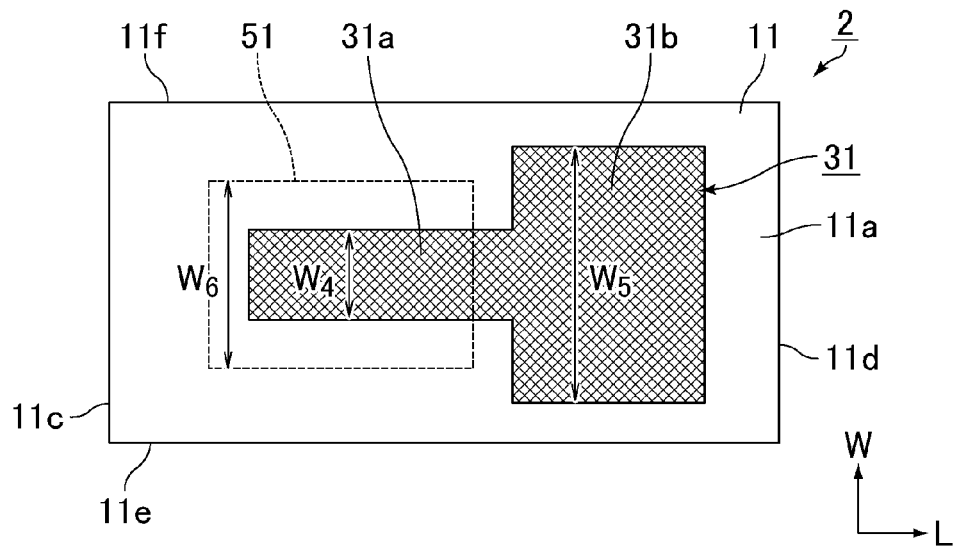
FIG. 16 is a plan view further explaining a state of a circuit layer in FIG. 15.

FIG. 16 is a plan view further explaining the state of the circuit layer in FIG. 15.

As illustrated in FIG. 16, the first electrode layer 31 has a first facing portion 31a that faces the second electrode layer 51 and a first non-facing portion 31b that does not face the second electrode layer 51.

A maximum length of the first non-facing portion 31b in the width direction (e.g., the length indicated by double-headed arrow $W_5$ in FIG. 16) is longer than a maximum length of the first facing portion 31a in the width direction (e.g., the length indicated by double-headed arrow $W_4$ in FIG. 16). It is also noted that since the second electrode layer 51 has a substantially rectangular shape whose length in the width direction is constant, the maximum length of the second electrode layer 51 in the width direction (e.g., the length indicated by double-headed arrow $W_6$ in FIG. 16) is equal to an average length of the second electrode layer 51 in the width direction.

When a maximum length $W_5$ of the first non-facing portion in the width direction is longer than a maximum length $W_4$ of the first facing portion in the width direction, an effect of shielding, by the first non-facing portion, the electric lines of force generated between the second electrode layer and the semiconductor substrate increases. Thus, conductor loss is suppressed in this configuration.

It is noted that the maximum length of the first facing portion 31a in the width direction corresponds to a maximum length of the narrow portion 32 in the width direction, and the maximum length of the first non-facing portion 31b in the width direction corresponds to a maximum length of the wide portion 33 in the width direction.

Part of the narrow portion 32 of the first electrode layer 31 is the first facing portion 31a facing the second electrode layer 51.

Moreover, a portion of the narrow portion 32 of the first electrode layer 31 not coinciding with the first facing portion 31a and the entirety of the wide portion 33 are the first non-facing portion 31b not facing the second electrode layer 51.

In the exemplary aspect, an average length $W_6$ of the second electrode layer 51 in the width direction W is preferably longer than the maximum length $W_4$ of the first facing portion 31a. Further, the average length $W_6$ of the second electrode layer 51 in the width direction W is preferably shorter than the maximum length $W_5$ of the first non-facing portion 31b in the width direction W.

Figure 17:
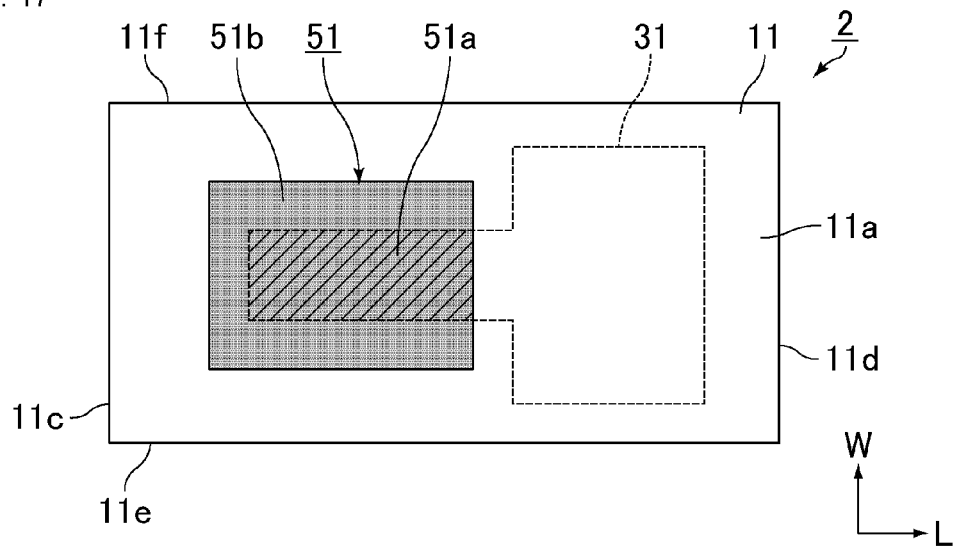
FIG. 17 is a plan view further explaining a state of the circuit layer in FIG. 15.

FIG. 17 is a plan view further explaining the state of the circuit layer in FIG. 15.

As illustrated in FIG. 17, the second electrode layer 51 has a second facing portion 51a that faces the first electrode layer 31 and a second non-facing portion 51b that does not face the first electrode layer 31.

When the second electrode layer 51 has the second non-facing portion 51b not facing the first electrode layer 31, electric lines of force generated between the first electrode layer 31 and a conductor, such as a land electrically connected to the second electrode layer 51, is shielded by the second non-facing portion 51b of the second electrode layer 51. Thus, conductor loss is suppressed according to this configuration.

It is noted that a semiconductor device having both the feature of the first exemplary embodiment and the feature of the second exemplary embodiment of the semiconductor device can also be implemented as the semiconductor device of the present invention. Examples of a circuit layer forming a semiconductor device having both the feature of the first exemplary embodiment and the feature of the second exemplary embodiment of the semiconductor device are illustrated in FIG. 18 and FIG. 19.

Figure 18:
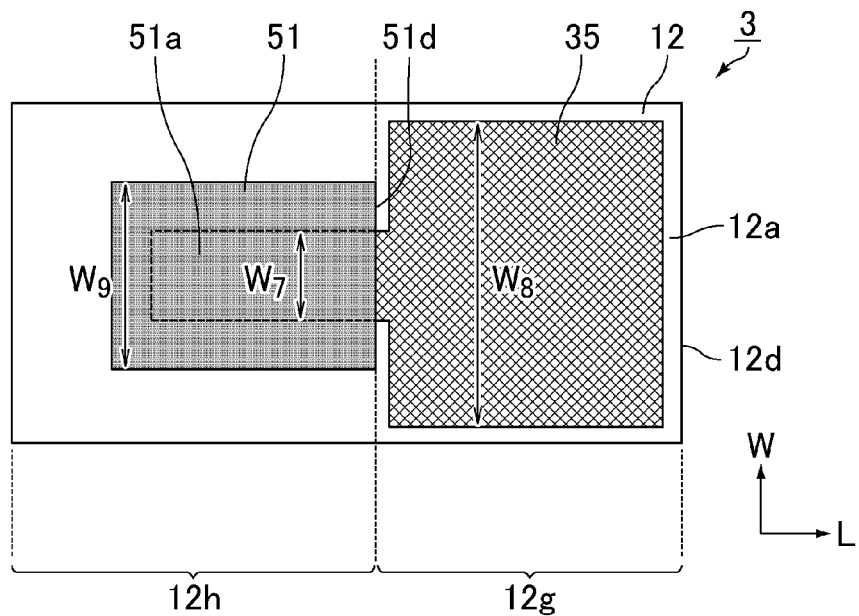
FIG. 18 is a plan view illustrating a positional relationship between a semiconductor substrate, a first electrode layer, and a second electrode layer of another example of the semiconductor device.
Figure 19:
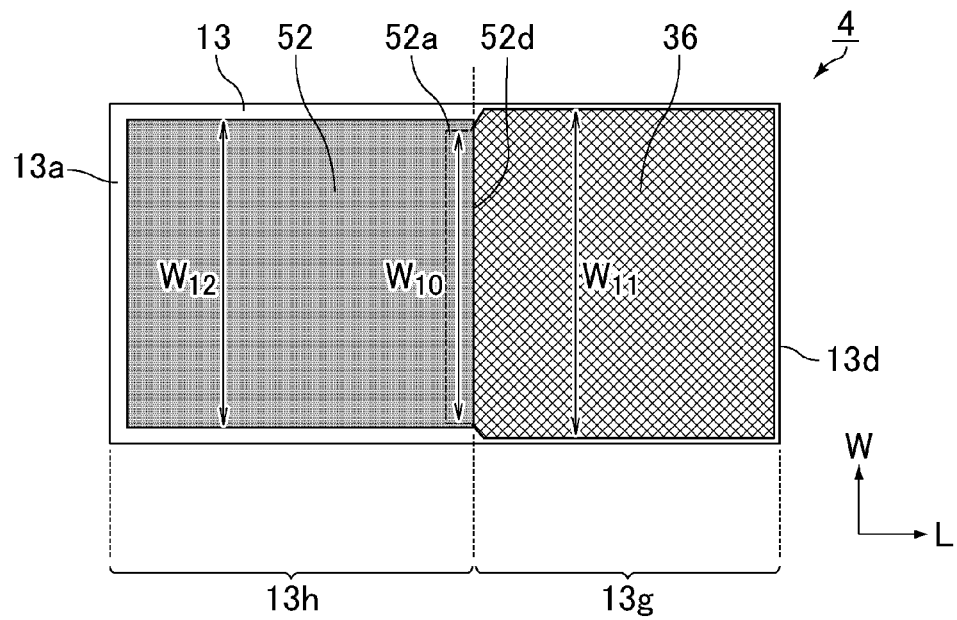
FIG. 19 is a plan view illustrating a positional relationship between a semiconductor substrate, a first electrode layer, and a second electrode layer of still another example of the semiconductor device.

FIG. 18 is a plan view illustrating a positional relationship between a semiconductor substrate, a first electrode layer, and a second electrode layer of another example of the semiconductor device.

In a semiconductor device 3 illustrated in FIG. 18, a first electrode layer 35 and the second electrode layer 51 are provided (or otherwise disposed) on a first main surface 12a of a semiconductor substrate 12 to face each other. A region of the semiconductor substrate 12 may be divided into a second electrode layer non-formation region 12g and a region 12h other than the second electrode layer non-formation region. The second electrode layer non-formation region 12g is a region on a side of a second end surface 12d of the semiconductor substrate 12 relative to the end portion 51d of the second facing portion 51a, at which the second electrode layer 51 faces the first electrode layer 35, on the side of the second end portion 12d.

In FIG. 18, a ratio $P_1$ of an area of the first electrode layer 35 to the second electrode layer non-formation region 12g is larger than that in FIG. 15 and is between 80% and 100% (e.g., approximately 82% in FIG. 18). Further, the ratio of the area of the first electrode layer 35 to the region 12h other than the second electrode layer non-formation region is between 5% and 60% (e.g., approximately 16% in FIG. 18).

Furthermore, as illustrated in FIG. 18, a maximum length $W_8$ of a region of the first electrode layer 35 not facing the second electrode layer 51 (e.g., a first non-facing portion) in the width direction is longer than a maximum length $W_7$ of a region where the first electrode layer 35 faces the second electrode layer 51 (e.g., a first facing portion) in the width direction. In addition, the maximum length $W_9$ of the second electrode layer 51 in the width direction is longer than the maximum length $W_7$ of the first facing portion in the width direction.

FIG. 19 is a plan view illustrating a positional relationship between a semiconductor substrate, a first electrode layer, and a second electrode layer of still another example of the semiconductor device.

FIG. 19 is a view schematically illustrating shapes of a semiconductor substrate 13, a first electrode layer 36, and a second electrode layer 52, and a positional relationship therebetween when a circuit layer formed on a first main surface 13a of the semiconductor substrate 13 is viewed from above.

In a semiconductor device 4 illustrated in FIG. 19, the first electrode layer 36 and the second electrode layer 52 are provided on the first main surface 13a of the semiconductor substrate 13 to face each other. A region of the semiconductor substrate 13 may be divided into a second electrode layer non-formation region 13g and a region 13h other than the second electrode layer non-formation region. The second electrode layer non-formation region 13g is a region on a side of a second end surface 13d of the semiconductor substrate 13 relative to an end portion 52d of a second facing portion 52a, at which the second electrode layer 52 faces the first electrode layer 36, on the side of the second end portion 13d.

In FIG. 19, a ratio $P_1$ of an area of the first electrode layer 36 to the second electrode layer non-formation region 13g is larger than that in FIG. 15 and between 80% and 100% (e.g., approximately 96% in FIG. 19). Further, the ratio of the area of the first electrode layer 36 to the region 13h other than the second electrode layer non-formation region is between 5% and 60% (e.g., approximately 6% in FIG. 19).

Furthermore, as illustrated in FIG. 19, a maximum length $W_{11}$ of a region of the first electrode layer 36 not facing the second electrode layer 52 (e.g., a first non-facing portion) in the width direction is longer than a maximum length $W_{10}$ of a region of the first electrode layer 36 facing the second electrode layer 52 (e.g., a first facing portion) in the width direction. In addition, the maximum length $W_{12}$ of the second electrode layer 52 in the width direction is longer than the maximum length $W_n$ of the first facing portion in the width direction.

Other exemplary embodiments of the semiconductor device of the present invention will be explained.

It is noted that in a case that the first exemplary embodiment of the semiconductor device and the second exemplary embodiment of the semiconductor device are not distinguished from each other, they may simply be referred to as the semiconductor device of the present invention.

Further, a semiconductor device appropriately combining a preferred form of the first exemplary embodiment of the semiconductor device and a preferred form of the second exemplary embodiment of the semiconductor device can also be implemented as the semiconductor device of the present invention.

In the semiconductor device according to an exemplary aspect, the ratio $P_1$ of the area of the first electrode layer to the second electrode layer non-formation region is preferably larger than the ratio $P_2$ of the area of the first electrode layer to the region other than the second electrode layer non-formation region.

Moreover, according to an exemplary aspect, the ratio $P_2$ of the area of the first electrode layer to the area other than the second electrode layer non-formation region is preferably between 5% and 60%.

In a case that the ratio $P_2$ is less than 5%, the area in which the first electrode layer and the second electrode layer face each other is too small to ensure sufficient electrostatic capacity in some cases. Whereas in a case that the ratio $P_2$ exceeds 60%, there is a case that the second electrode layer is not able to sufficiently shield the electric lines of force generated between the first electrode layer and a conductor, such as a land electrically connected to the second electrode layer.

The ratio of the area of the second non-facing portion to the area of the second electrode layer is preferably between 50% and 90%. The electric lines of force generated between the first electrode layer and a conductor, such as a land electrically connected to the second electrode layer, may be shielded by the second non-facing portion. With this configuration, when the ratio of the area of the second non-facing portion to the area of the second electrode layer is 50% or less, it becomes impossible to sufficiently shield the electric lines of force. This may cause an increase of conductor loss. Whereas in a case that the ratio of the area of the second non-facing portion to the area of the second electrode layer exceeds 90%, the area of the second facing portion becomes too small. This may cause a decrease in electrostatic capacity.

Moreover, the ratio of the area of the first non-facing portion to the first electrode layer is preferably between 50% and 90%. Since the first non-facing portion is a portion of the first electrode layer that does not face the second electrode layer, the first non-facing portion shields electric lines of force generated between the second electrode layer and the semiconductor substrate. Thus, conductor loss is suppressed according to this configuration. With this, in a case that the ratio of the area of the first non-facing portion to the first electrode layer is within the range described above, conductor loss may be suppressed.

In the semiconductor device according to an exemplary aspect, a maximum length of the second electrode layer in the width direction is preferably longer than an average length of the first facing portion in the width direction when the circuit layer is viewed from above.

Moreover, it is preferable that a ratio of the average length of the first facing portion in the width direction to the maximum length of the second electrode layer in the width direction is between 70% and 90%.

In a case that the ratio described above is between 70% and 90%, when the semiconductor device is mounted on a mounting substrate and a voltage is applied, it is possible to ensure sufficient electrostatic capacity while maintaining the effect of shielding, by the second electrode layer, electric lines of force generated in a curved manner along the width direction of the semiconductor substrate, among those generated between the first electrode layer and a conductor, such as a land connected to the second electrode layer.

In a case that the ratio described above is less than 70%, there is a case that the semiconductor device is not able to ensure sufficient electrostatic capacity. Whereas in a case that the ratio described above exceeds 90%, there is a case that the second electrode layer is not able to sufficiently shield the generation of the electric lines of force in a curved manner between the first electrode layer and a conductor, such as a land electrically connected to the second electrode layer.

In the semiconductor device according to an exemplary aspect, it is preferable that a shortest distance from the first end surface of the semiconductor substrate to the first electrode layer is longer than a shortest distance from the first end surface to the second electrode layer in a plan view of the circuit layer.

Moreover, the length of the first facing portion in the width direction is preferably between 20% and 40% of the width of the semiconductor substrate.

The length of the first non-facing portion in the width direction is preferably between 80% and 100% of the width of the semiconductor substrate.

The length of the second electrode layer in the width direction is preferably between 50% and 70% of the width of the semiconductor substrate.

In the semiconductor device according to an exemplary aspect, each of the shapes of the first electrode layer and the second electrode layer is not particularly limited, and examples thereof include a polygon, such as a triangle, a quadrangle, or a pentagon, a circle, such as a circle or an ellipse, and a combination of these shapes.

Moreover, the shape of the first electrode layer is preferably a shape combining two substantially rectangular shapes. The shape of the second electrode layer is preferably a substantially rectangular shape.

Examples of the shape combining two substantially rectangular shapes include a substantially T-shape in which a relatively wide substantially rectangular shape and a relatively narrow substantially rectangular shape are continuously placed along the length direction of the semiconductor substrate. The long sides of the two substantially rectangular shapes forming the substantially T-shape may be substantially orthogonal to each other. For example, a shape in which a first substantially rectangular shape whose long sides extend along the length direction and a second substantially rectangular shape whose long sides extend along the length direction are continuously placed in the length direction, a shape in which a first substantially rectangular shape whose long sides extend along the width direction and a second substantially rectangular shape whose long sides extend along the width direction are continuously placed in the length direction, and a shape in which a first substantially rectangular shape whose long sides extend along the length direction and a second substantially rectangular shape whose long sides extend along the width direction are continuously placed in the length direction correspond to the substantially T-shape as long as the lengths of the substantially rectangular shapes in the width direction of the semiconductor substrate are different from each other.

As a combination of shapes of the first electrode layer and the second electrode layer, the first electrode layer preferably has a substantially T-shape and the second electrode layer has a single substantially rectangular shape according to an exemplary aspect.

In a case that the first electrode layer has a substantially T-shape, it is preferable that the first electrode layer and the second electrode layer are disposed such that at least part of a substantially rectangular shape with a relatively small length in the width direction (e.g., a narrow portion) faces the second electrode layer and such that a substantially rectangular shape with a relatively large length in the width direction (e.g., a wide portion) does not face the second electrode layer.

When the circuit layer is viewed from above, an area based on an external size of the second outer electrode is preferably smaller than an area based on an external size of the second electrode layer. When the area based on the external size of the second outer electrode is smaller than the area based on the external size of the second electrode layer, the generation of the electric lines of force in a curved manner between the first electrode layer and a conductor, such as a land electrically connected to the second outer electrode, is lowered. Thus, electric lines of force are easily shielded by the second electrode layer.

It is also noted that the external size of the second outer electrode in a plan view of the circuit layer is a size based on an external shape when the second outer electrode is projected in the thickness direction.

Hereinafter, each component forming the semiconductor device will be explained.

Examples of the material forming the semiconductor substrate include silicon, gallium arsenide, glass, and the like according to exemplary aspects.

The electrical resistivity of the semiconductor substrate is preferably $10^3$ Ωcm or more and $10^8$ Ωcm or less, for example.

In a case that the electrical resistivity of the semiconductor substrate is $10^3$ Ωcm or more, conductor loss may be further suppressed.

The external sizes of the semiconductor substrate are not particularly limited, but according to an exemplary aspect, the length can be 200 μm or more and 600 μm or less, the thickness can be 100 μm or more and 250 μm or less, and the width can be 100 μm or more and 300 μm or less.

Examples of the material forming the first electrode layer include metals, such as Cu, Ag, Au, Al, Ni, Cr, and Ti, or conductors containing these metals according to exemplary aspects.

Further, the first metal layer may have two or more conductor layers made of the material described above in an exemplary aspect.

The thickness of the first electrode layer is not particularly limited but can be 0.3 μm or more and 10 μm or less and preferably 0.5 μm or more and 3 μm or less according to an exemplary aspect.

Examples of the material forming the dielectric layer include material having dielectric or insulation property, such as oxides, such as SiO, $Al_2O_3$, $HfO_2$, $Ta_2O_5$, $ZrO_2$, or nitrides, such as $Si_3N_4$ according to exemplary aspects.

The thickness of the dielectric layer is not particularly limited, but can be 0.02 μm or more and 2 μm or less, for example.

As the material forming the second electrode layer, the same material as that forming the first electrode layer may suitably be used.

The thickness of the second electrode layer is not particularly limited, but can be 0.3 μm or more and 10 μm or less and more preferably 0.5 μm or more and 5 μm or less according to an exemplary aspect.

Examples of the materials forming the first outer electrode and the second outer electrode include Cu, Al, and the like according to exemplary aspects.

Moreover, a plating layer may be formed on the outermost surface of the first outer electrode and the second outer electrode. Examples of the plating layer include an Au plating layer, a Sn plating layer, or the like according to exemplary aspects.

It is generally noted that the material forming the first outer electrode and the material forming the second outer electrode may be the same or different from each other.

Moreover, in the semiconductor device of the present invention, an insulation layer can be provided between the first main surface of the semiconductor substrate and the first electrode layer according to an exemplary aspect.

In a case that the insulation layer is provided between the first main surface of the semiconductor substrate and the first electrode layer, it is possible to further suppress conductor loss of the substrate.

Examples of the material forming the insulation layer include alumina or the like, for example. Moreover, the thickness of the insulation layer is not particularly limited, but is can be 0.5 μm or more and 3 μm or less, for example.

In the semiconductor device of the present invention, a protection layer for protecting the dielectric layer and/or the second electrode layer from moisture can be formed partly on the dielectric layer and the second electrode layer. Examples of the material forming the protection layer include polyimide resin, silicon oxide, and the like according to exemplary aspects.

The thickness of the protection layer is not particularly limited, but can be 1 μm or more and 20 μm or less, for example.

The thickness of the entire circuit layer is preferably 30 μm or more and 70 μm or less.

[Method of Manufacturing Semiconductor Device]

The semiconductor device of the present invention can be manufactured, for example, by a method of sequentially forming a first electrode layer, a dielectric layer, a second electrode layer, a first outer electrode, and a second outer electrode forming a circuit layer on a surface of a semiconductor substrate with photolithography or the like. In this case, the first electrode layer has a first facing portion facing the second electrode layer and a first non-facing portion not facing the second electrode layer, and the second electrode layer has a second facing portion facing the first electrode layer and a second non-facing portion not facing the first electrode layer.

Furthermore, the first exemplary embodiment of the semiconductor device can be manufactured according to the following exemplary steps. The first outer electrode is disposed on the side of the second end portion of the semiconductor substrate relative to the second outer electrode, the center of gravity of the first electrode layer is located on the side of the second end surface of the semiconductor substrate relative to the center of gravity of the second electrode layer, and then, the ratio of an area of the first electrode layer to a region on the side of the second end surface relative to the end portion of the second electrode layer on the side of the second end surface is made to be between 80% and 100%.

Whereas the semiconductor device of the second exemplary embodiment can be manufactured by making the maximum length of the first non-facing portion in the width direction longer than the average length of the first facing portion.

[Module]

According to an exemplary aspect, a module can be provided that includes the semiconductor device of the present invention, a first land electrically connected to the first outer electrode, and a second land electrically connected to the second outer electrode. Since the module according to an exemplary aspect includes the semiconductor device of the present invention, conductor loss is small.

Figure 20:
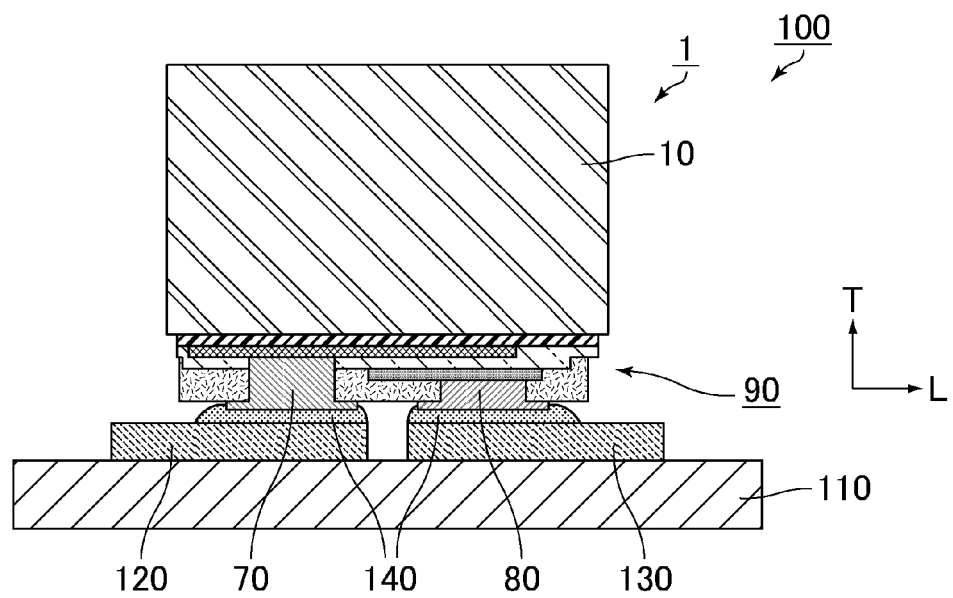
FIG. 20 is a sectional view schematically illustrating an example of a module of the present invention.

FIG. 20 is a sectional view schematically illustrating an example of the module of the present invention.

As illustrated in FIG. 20, a module 100 includes the semiconductor device 1, a first land 120 electrically connected to the first outer electrode 70 of the semiconductor device 1, and the second land 130 electrically connected to the second outer electrode 80 of the semiconductor device 1. The first outer electrode 70 and the first land 120 are connected to each other with solder 140, and the second outer electrode 80 and the second land 130 are connected to each other with solder 140 according to an exemplary aspect. The first land 120 and the second land 130 are fixed on the mounting substrate 110. With this configuration, in the module 100, the semiconductor device 1 is mounted on the mounting substrate 110 via the first land 120 and the second land 130.

In the module of the present invention, an alternating current is preferably applied between the first land and the second land.

Electric lines of force are generated each time the electric potential between the electrodes is switched. With this, when an alternating current is applied between the first land and the second land, conductor loss tends to increase. Since the module of the present invention includes the semiconductor device of the present invention, the module is suitable for use under a condition in which conductor loss tends to increase, that is, a condition in which an alternating current is applied between the first land and the second land.

REFERENCE SIGNS LIST 1, 2, 3, 4 SEMICONDUCTOR DEVICE
10, 11, 12, 13 SEMICONDUCTOR SUBSTRATE
10a, 11a, 12a, 13a FIRST MAIN SURFACE
10b, 11b SECOND MAIN SURFACE
10c FIRST END SURFACE
10d, 11d, 12d, 13d SECOND END SURFACE
10e, 11e FIRST SIDE SURFACE
10f, 11f SECOND SIDE SURFACE
10g, 12g, 13g SECOND ELECTRODE LAYER NON-FORMATION REGION
10h, 12h, 13h REGION OTHER THAN SECOND ELECTRODE LAYER NON-FORMATION REGION
20, 21 INSULATION LAYER
30, 31, 35, 36 FIRST ELECTRODE LAYER
30a, 31a FIRST FACING PORTION
30b, 31b FIRST NON-FACING PORTION
32 NARROW PORTION OF FIRST ELECTRODE LAYER
33 WIDE PORTION OF FIRST ELECTRODE LAYER
40, 41 DIELECTRIC LAYER
50, 51, 52 SECOND ELECTRODE LAYER
50a, 51a, 52a SECOND FACING PORTION
50b SECOND NON-FACING PORTION
50d, 51d, 52d END PORTION OF SECOND ELECTRODE LAYER ON THE SIDE OF SECOND END SURFACE
60, 61 PROTECTION LAYER
70, 71 FIRST OUTER ELECTRODE
80, 81 SECOND OUTER ELECTRODE
90, 91 CIRCUIT LAYER
100 MODULE
110 MOUNTING SUBSTRATE
120 FIRST LAND
130 SECOND LAND
140 SOLDER
e ELECTRIC LINES OF FORCE $g_3$ CENTER OF GRAVITY OF FIRST ELECTRODE LAYER
$g_5$ CENTER OF GRAVITY OF SECOND ELECTRODE LAYER
$L_1$, $L_6$ SHORTEST DISTANCE FROM FIRST END SURFACE TO FIRST ELECTRODE LAYER IN LENGTH DIRECTION
$L_2$, $L_7$ SHORTEST DISTANCE FROM FIRST END SURFACE TO SECOND ELECTRODE LAYER IN LENGTH DIRECTION
$L_3$, $L_8$ DISTANCE FROM END PORTION OF FIRST ELECTRODE LAYER ON THE SIDE OF FIRST END SURFACE TO END PORTION OF SECOND ELECTRODE LAYER ON THE SIDE OF FIRST END SURFACE IN LENGTH DIRECTION
$L_4$, $L_9$ LENGTH OF SECOND FACING PORTION IN LENGTH DIRECTION
$L_{10}$ LENGTH OF SECOND ELECTRODE LAYER IN LENGTH DIRECTION
$L_{11}$ SHORTEST DISTANCE BETWEEN WIDE PORTION OF FIRST ELECTRODE LAYER AND SECOND ELECTRODE LAYER IN LENGTH DIRECTION
$W_1$, $W_4$, $W_7$, $W_{10}$ MAXIMUM LENGTH OF FIRST FACING PORTION IN WIDTH DIRECTION
$W_{1a}$ AVERAGE LENGTH OF FIRST FACING PORTION IN WIDTH DIRECTION
$W_2$, $W_5$, $W_3$, $W_{11}$ MAXIMUM LENGTH OF FIRST NON-FACING PORTION IN WIDTH DIRECTION
$W_3$, $W_6$, $W_9$, $W_{12}$ MAXIMUM LENGTH OF SECOND ELECTRODE LAYER IN WIDTH DIRECTION
1' SEMICONDUCTOR DEVICE
10' SEMICONDUCTOR SUBSTRATE
10a' FIRST MAIN SURFACE
10b' SECOND MAIN SURFACE
10c' FIRST END SURFACE
10d' SECOND END SURFACE
10e' FIRST SIDE SURFACE
10f' SECOND SIDE SURFACE
10g' SECOND ELECTRODE LAYER NON-FORMATION REGION
10h' REGION OTHER THAN SECOND ELECTRODE LAYER NON-FORMATION REGION
20' INSULATION LAYER
30' FIRST ELECTRODE LAYER
40' DIELECTRIC LAYER
50' SECOND ELECTRODE LAYER
50d' END PORTION OF SECOND ELECTRODE LAYER ON THE SIDE OF SECOND END SURFACE
60' PROTECTION LAYER
80' SECOND OUTER ELECTRODE
90' CIRCUIT LAYER
$W_1'$ MAXIMUM LENGTH OF FIRST FACING PORTION IN WIDTH DIRECTION
$W_2'$ MAXIMUM LENGTH OF FIRST NON-FACING PORTION IN WIDTH DIRECTION
$W_3'$ MAXIMUM LENGTH OF SECOND ELECTRODE LAYER IN WIDTH DIRECTION
$L_1'$ SHORTEST DISTANCE FROM FIRST END SURFACE TO FIRST ELECTRODE LAYER IN LENGTH DIRECTION
$L_2'$ SHORTEST DISTANCE FROM FIRST END SURFACE TO SECOND ELECTRODE LAYER IN LENGTH DIRECTION

The invention claimed is:

1. A semiconductor device comprising:
a semiconductor substrate having first and second main surfaces opposing each other in a thickness direction, first and second end surfaces opposing each other in a length direction orthogonal to the thickness direction, and first and second side surfaces opposing each other in a width direction orthogonal to the thickness direction and the length direction; and
a circuit layer disposed on the first main surface of the semiconductor substrate and including:
a first electrode layer disposed on a side of the semiconductor substrate,
a dielectric layer disposed on the first electrode layer,
a second electrode layer disposed on the dielectric layer,
a first outer electrode electrically connected to the first electrode layer and extending in the thickness direction to a surface of the circuit layer, and
a second outer electrode electrically connected to the second electrode layer and extending in the thickness direction to the surface of the circuit layer,
wherein, in a plan view of the circuit layer, the first electrode layer has a first facing portion that overlaps the second electrode layer in the thickness direction and a first non-facing portion that does not overlap the second electrode layer in the thickness direction, the second electrode layer has a second facing portion that overlaps the first electrode layer in the thickness direction and a second non-facing portion that does not overlap the first electrode layer in the thickness direction, the first outer electrode is disposed on a side of the second end surface of the semiconductor substrate relative to the second outer electrode, and a center of gravity of the first electrode layer is located on the side of the second end surface relative to a center of gravity of the second electrode layer, and
wherein a ratio $P_1$ of an area of the first electrode layer to a second electrode layer non-formation region is between 80% and 100%, and
wherein the second electrode layer non-formation region is a region of the semiconductor substrate on the side of the second end surface relative to an end portion of the second facing portion on the side of the second end surface.

2. The semiconductor device according to claim 1, wherein, in the plan view of the circuit layer, the ratio $P_1$ of the area is larger than a ratio $P_2$ of an area of the first electrode layer to a region of the semiconductor substrate other than the second electrode layer non-formation region.

3. The semiconductor device according to claim 2, wherein the ratio $P_2$ is between 5% and 60%.

4. The semiconductor device according to claim 1, wherein, in the plan view of the circuit layer, a maximum length of the first non-facing portion in the width direction is longer than a maximum length of the first facing portion in the width direction.

5. The semiconductor device according to claim 1, wherein, in the plan view of the circuit layer, an average length of the first non-facing portion in the width direction is longer than a maximum length of the second electrode layer in the width direction.

6. The semiconductor device according to claim 5, wherein, in the plan view of the circuit layer, the maximum length of the second electrode layer in the width direction is longer than an average length of the first facing portion in the width direction.

7. The semiconductor device according to claim 1, wherein, in the plan view of the circuit layer, a shortest distance from the first end surface of the semiconductor substrate to the first electrode layer in the length direction is longer than a shortest distance from the first end surface of the semiconductor substrate to the second electrode layer.

8. The semiconductor device according to claim 1, wherein, in the plan view of the circuit layer, a shape of the first electrode layer is a shape having a narrow portion and a wide portion with the narrow portion having a width in the width direction that is less than the width of the wide portion in the width direction, a shape of the second electrode layer is a rectangular shape, and at least part of the narrow portion is the first facing portion.

9. The semiconductor device according to claim 1, further comprising an insulation layer disposed between the first main surface of the semiconductor substrate and the first electrode layer.

10. The semiconductor device according to claim 1, wherein the semiconductor substrate has an electrical resistivity of $10^3$ Ωcm or more.

11. A module comprising:
the semiconductor device according to claim 1;
a first land electrically connected to the first outer electrode; and
a second land electrically connected to the second outer electrode.

12. The module according to claim 11, wherein a physical connection between the first land and the second land is configured to receive an alternating current.

13. A semiconductor device comprising:
a semiconductor substrate having first and second main surfaces opposing each other in a thickness direction, first and second end surfaces opposing each other in a length direction orthogonal to the thickness direction, and first and second side surfaces opposing each other in a width direction orthogonal to the thickness direction and the length direction; and
a circuit layer disposed on the first main surface of the semiconductor substrate and including:
a first electrode layer disposed on a side of the semiconductor substrate,
a dielectric layer disposed on the first electrode layer,
a second electrode layer disposed on the dielectric layer,
a first outer electrode electrically connected to the first electrode layer and disposed exclusively on the first main surface of the semiconductor substrate, the first outer electrode extending in the thickness direction to a surface of the circuit layer, and
a second outer electrode electrically connected to the second electrode layer and disposed exclusively on the first main surface of the semiconductor substrate, the second outer electrode extending in the thickness direction to the surface of the circuit layer,
wherein, in a plan view of the circuit layer, the first electrode layer has a first facing portion that overlaps the second electrode layer in the thickness direction and a first non-facing portion that does not overlap the second electrode layer in the thickness direction, and the second electrode layer has a second facing portion that overlaps the first electrode layer in the thickness direction and a second non-facing portion that does not overlap the first electrode layer in the thickness direction, and
wherein a maximum length of the first non-facing portion in the width direction is longer than an average length of the first facing portion in the width direction.

14. The semiconductor device according to claim 13, wherein:
in the plan view of the circuit layer, the first outer electrode is disposed on a side of the second end surface of the semiconductor substrate relative to the second outer electrode,
a center of gravity of the first electrode layer is located on the side of the second end surface relative to a center of gravity of the second electrode layer,
a ratio $P_1$ of an area of the first electrode layer to a second electrode layer non-formation region is between 80% and 100%, and
the second electrode layer non-formation region is a region of the semiconductor substrate on the side of the second end surface relative to an end portion of the second facing portion on the side of the second end surface.

15. The semiconductor device according to claim 14, wherein, in the plan view of the circuit layer, the ratio $P_1$ of the area is larger than a ratio $P_2$ of an area of the first electrode layer to a region of the semiconductor substrate other than the second electrode layer non-formation region.

16. The semiconductor device according to claim 15, wherein the ratio $P_2$ is between 5% and 60%.

17. The semiconductor device according to claim 13, wherein, in the plan view of the circuit layer, the maximum length of the first non-facing portion in the width direction is longer than a maximum length of the first facing portion in the width direction.

18. The semiconductor device according to claim 13, wherein, in the plan view of the circuit layer, a shortest distance from the first end surface of the semiconductor substrate to the first electrode layer in the length direction is longer than a shortest distance from the first end surface of the semiconductor substrate to the second electrode layer.

19. A module comprising:
the semiconductor device according to claim 13;
a first land electrically connected to the first outer electrode; and
a second land electrically connected to the second outer electrode.

20. The module according to claim 19, wherein a physical connection between the first land and the second land is configured to receive an alternating current.

* * * * *